United States Patent [19]
Gebara et al.

[11] Patent Number: 6,137,678
[45] Date of Patent: *Oct. 24, 2000

[54] CONFIGURING A COMPUTER SYSTEM

[75] Inventors: Ghassan R. Gebara, Spring; David F. Bolognia, Kingwood, both of Tex.

[73] Assignee: Compaq Computer Corporation, Houston, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/941,409

[22] Filed: Sep. 30, 1997

[51] Int. Cl.⁷ ..................................................... G06F 1/16
[52] U.S. Cl. ...................... 361/685; 361/727; 361/684; 312/223.2
[58] Field of Search ................... 361/684, 724, 361/725, 727, 685, 683; 312/223.2; 439/928.1

[56] References Cited

U.S. PATENT DOCUMENTS

| | | | |
|---|---|---|---|
| 5,227,957 | 7/1993 | Deters | 439/926.1 |
| 5,305,183 | 4/1994 | Teynor | 361/683 |
| 5,340,340 | 8/1994 | Hastings et al. | 361/727 |
| 5,460,441 | 10/1995 | Hastings et al. | 361/727 |
| 5,513,068 | 4/1996 | Girard | 361/685 |
| 5,555,158 | 9/1996 | Dent | 361/684 |
| 5,737,184 | 4/1998 | Lai | 361/683 |
| 5,748,442 | 5/1998 | Toor | 361/685 |
| 5,761,030 | 6/1998 | Roscoe | 361/684 |
| 5,793,616 | 8/1998 | Aubuchon et al. | 361/684 |
| 5,805,420 | 9/1998 | Burke | 361/727 |
| 5,865,518 | 2/1999 | Jarrett et al. | 312/223.2 |
| 5,959,841 | 9/1999 | Allen et al. | 361/725 |

*Primary Examiner*—Leo P. Picard
*Assistant Examiner*—John Reed
*Attorney, Agent, or Firm*—Conley, Rose & Tayon, P.C.; Michael F. Heim; Jonathan M. Harris

[57] ABSTRACT

A computer system includes a chassis, a tray and a motherboard. The tray is configured to form a detachable connection with the chassis, and the motherboard is mounted to the tray.

25 Claims, 11 Drawing Sheets

CONFIGURING A COMPUTER SYSTEM

BACKGROUND

The invention relates to configuring a computer system.

A computer system typically has a frame, or chassis, upon which components of the system are mounted. These components typically include mass storage devices and system circuit boards. One of these system boards, called a motherboard, typically has a central processing unit (CPU) around which most of the processing activity of the computer system is centered.

Computer system designers primarily design the chassis to accommodate a particular motherboard form factor which defines, among other things, the physical dimensions of the motherboard and the placement of expansion cards inside the chassis. Typically, a chassis designed for one motherboard form factor is not capable of accommodating a motherboard having a different form factor. Thus, for example, a motherboard having an ATX form factor typically cannot be used with a chassis designed for an NLX or an LPX form factor.

SUMMARY

In general, in one aspect, the invention features a computer system that includes a chassis, a tray and a motherboard. The tray is configured to form a detachable connection with the chassis, and the motherboard is mounted to the tray.

The invention may have one or more of the following advantages. A computer system may more easily be built to order (BTO) or configured to order (CTO). Different form factor standards are accommodated. Mass storage devices (e.g., a floppy disk drive, a hard disk drive and/or a CD-ROM drive) may be rotated to a desired orientation. Assembly time is reduced. Upgrades are easier to perform. Time required for service is reduced. The computer system is easier to service, and the required down time for servicing is reduced. Manufacturing costs are reduced. More parts are shared between different computer system configurations, and thus, less inventory is required.

Implementations of the invention may include one or more of the following features. The chassis may have rails, and the tray may be configured to slide in the rails. The chassis may include an opening for receiving the tray, and the tray may be also be configured to close the opening when the tray is inserted in the chassis. The computer system may also include a power supply that is mounted to the tray. The computer system may also include a system board (e.g., a peripheral backplane board) that is mounted to the chassis and is configured to form an electrical connection with the motherboard when the tray is attached to the chassis. The computer system may also include a fan that is mounted to the tray.

The computer system may also include a riser board that is connected to the motherboard. The computer system may also include a system board (e.g., a power supply backplane board) that is mounted to the chassis and is configured to form an electrical connection with the riser board when the tray is attached to the chassis.

The computer system may include another tray (e.g., a box-like shell) that is configured to form a slidable connection with the chassis, and a mass storage device may be mounted to this other tray.

In general, in another aspect, the computer system includes a chassis and a tray that is configured to form a detachable connection with the chassis. A mass storage device is mounted to the tray. The tray is configured to hold the mass storage device in at least two orientations.

Implementations of the invention may include one or more of the following features. The different orientations may be substantially orthogonal to each other, e.g., one orientation may be for a rack system and another orientation may be for a tower system. The tray may include a shoulder that defines a first region for receiving the mass storage device in one of the orientations and a second region for receiving the mass storage device in another one of the orientations. The computer system may also have another mass storage device, and the tray may also be configured to hold both mass storage devices in at least two different orientations.

In general, in another aspect, the invention features a method that includes configuring different trays to mount different motherboards. The trays are configured to detachably mount to a chassis. The method also includes mounting the motherboards to the trays.

Implementations of the invention may include one or more of the following. The different motherboards may include different form factor standards (e.g., an NLX, ATX, LPX, custom ATX or baby AT form factor standard).

In general, in another aspect, the invention features configuring a tray to form a slidable connection with the chassis and mounting a mass storage device to the tray.

Other advantages and features will become apparent from the following description and from the claims.

DESCRIPTION

Referring to FIGS. 1–5, a computer system 400 has features that permit the system 400 to be configured to order (CTO) and built to order (BTO) pursuant to a set of user selected options. Among these options are the choice of a particular motherboard, a particular power supply (e.g., a hotplug or a non-hotplug power supply), and an orientation (i.e., a rack or a tower system). Regardless of the options that are chosen, the computer system 400 is constructed using the same chassis 401, and structural modifications to the chassis 401 are not required.

Figure 1:
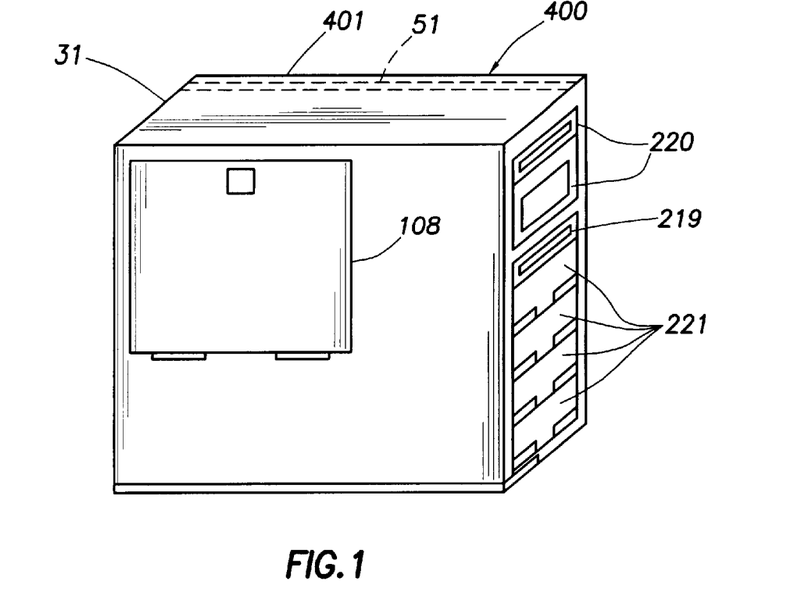
FIG. 1 is a perspective view of a computer system.
Figure 2:
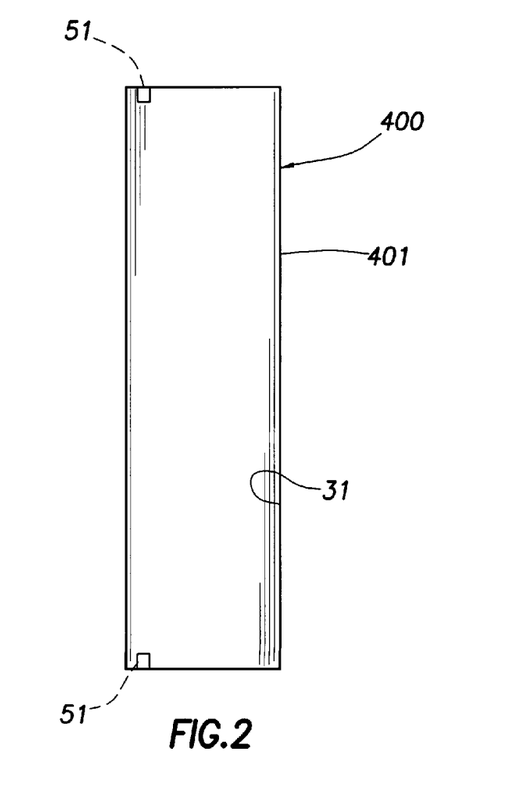
FIG. 2 is a rear view of a chassis of the computer system of FIG. 1.
Figure 3:
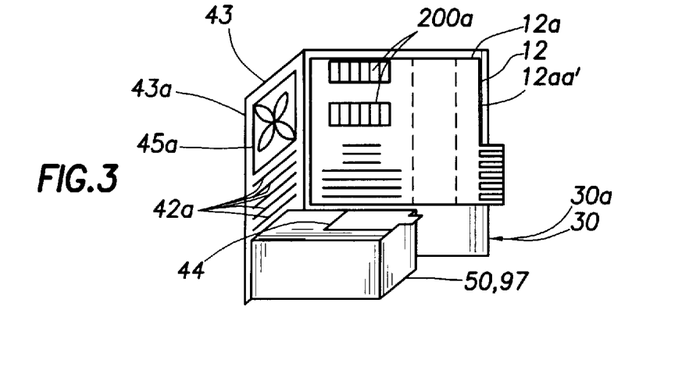
FIGS. 3, 4 and 5 are perspective views of trays of the computer system of FIG. 1.
Figure 4:
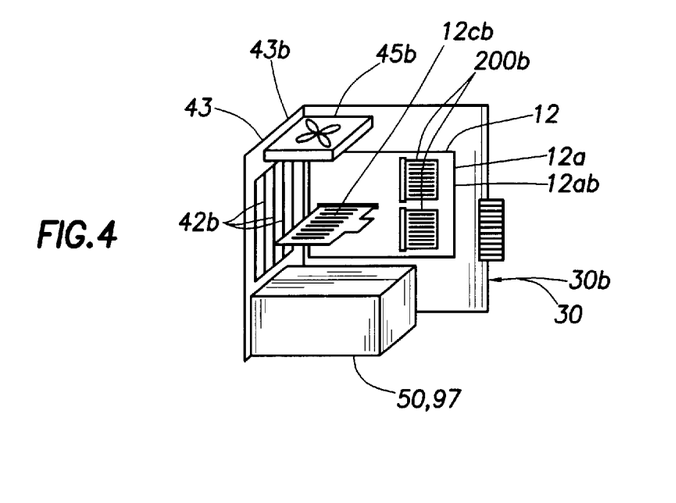
Figure 5:
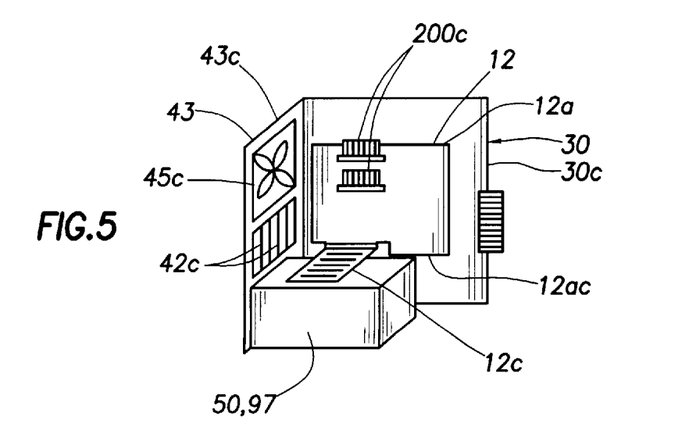

The number of different motherboards 12a that may be used with the chassis 401 is expanded through the use of different interchangeable, removable rear trays 30 (e.g., trays 30a, 30b and 30c). Each different tray 30 is configured to mount a different type of motherboard 12a to the chassis 401. As a result, once a type of motherboard 12a is chosen, the appropriate tray 30 is selected and used to mount the motherboard 12a to the chassis 401.

The type of the motherboard 12a might depend, for example, on the form factor of the motherboard 12a. In this manner, each tray 30 is associated with a different class (e.g., an AT, NLX or LPX class) of motherboard form factors and is constructed to mount a motherboard 12a from the associated class to the chassis 401. As a result of the tray, the chassis 401 does not need to be specially designed for a class of motherboard form factors.

The tray 30 and the chassis 401 are constructed in a manner so that the tray 30 forms a detachable, slidable connection with the chassis 401. Disassembly of the chassis 401, removal of a cover of the chassis 401, or structural modifications to the chassis 401 are not required to mount the tray 30 in or remove the tray 30 from the chassis 401.

Mounting the motherboard 12a to the chassis 401 includes securing the motherboard 12a to the tray 30 and then aligning the tray 30 with a guide rail 51 (see FIG. 2) of the chassis 401. The guide rail 51 is constructed to engage the tray 30 to direct the tray 30 into a rear opening 31 of the chassis 401 and guide the tray 30 into the chassis 401 until a rear piece 43 of the tray 30 closes the opening 31. As described below, once the tray 30 is fully inserted into the chassis 401, the motherboard 12a forms a plug-type connection with another system board to electrically connect the motherboard 12a to the system 400.

As is typical, the physical dimensions and general layout of the motherboard 12a are governed by a motherboard form factor standard. As a result, typically, in other computer systems, the design of the chassis is dependent on the form factor of the motherboard. For example, the placement of dielectric standoffs, or spacers, between the bottom of the chassis and the motherboard; the physical dimensions of the chassis; and the placement of an arm to support an expansion card riser board all depend on the form factor. As examples, ATX, baby AT, and custom ATX form factor standards typically require one type of chassis, an LPX form factor standard typically requires another type of chassis and an NLX form factor standard typically requires yet another type of chassis.

Unlike typical computers, in the computer system 400, the tray 30, instead of the chassis 401, is specifically designed for a particular class of form factor(s). In this manner, one tray 30a (see FIG. 3) is constructed for a motherboard 12aa having an ATX, baby AT or custom ATX form factor; another tray 30b (see FIG. 4) is constructed for a motherboard 12ab having an LPX form factor; and another tray 30c (see FIG. 5) is constructed for a motherboard 12ac having an NLX form factor.

Mounted to each tray 30 is a non-hot plug power supply 50 (or an optional hot plug power supply 97) and the motherboard 12a. In other arrangements, the power supply is separate from the tray 30. Each tray 30 includes a flat, rectangular piece 33 (e.g., a sheet of metal) upon which the motherboard 12a is mounted. The flat piece 33 is parallel to walls of the chassis 401 and is constructed for insertion into the chassis 401. Each tray 30 also includes the rear piece 43 which is a flat, generally rectangular piece that is integral with and orthogonal to the piece 33. The rear piece 43 is configured to close the opening 31 of the chassis 401 when the tray 30 is fully inserted into the chassis 401. The rear piece 40 also has slots 42 which permit access to communication ports of expansion cards of the computer system 400.

Referring to FIG. 3, among the differences between the trays 30a, 30b, and 30c, the tray 30a (for the motherboard 12aa having either the ATX, baby AT or custom ATX form factor) has slots 42a that are formed in the rear face 43a of the tray 30a. The slots 42a extend away from the motherboard 12a and are aligned with communication ports of expansion cards that are inserted into expansion slot connectors on the motherboard 12aa. The expansion cards, when inserted into the motherboard 12aa, are orthogonal to the motherboard 12aa. To cool CPUs 200a on the motherboard 12aa, a fan 45a is built into the rear piece 43a of the tray 30a and positioned to blow air over the CPUs 200a. The fan 45a receives power from short wires (not shown) that are connected to the motherboard 12aa.

Because the expansion slot connectors are built into the motherboard 12aa, an expansion card riser board with ISA, EISA and PCI expansion slots is not required. However, to couple power from a power supply backplane board 12d to the motherboard 12a, a pseudo riser board 44 having a power bus 25 (not shown in FIG. 3) is plugged into the motherboard 12aa as further described below. An arm (not shown) of the tray 30a is constructed to support the riser board 44.

Referring to FIG. 4, unlike the tray 30a, the tray 30b (for the motherboard 12ab having an LPX form factor) has slots 42b formed in a rear piece 43b of the tray 30b. The slots 42b are parallel to the motherboard 12ab and are aligned with communication ports of expansion cards that are inserted into expansion slot connectors on a riser board 12cb. The riser board 12cb is orthogonal to the motherboard 12ab and is plugged into the motherboard 12ab near the center of the motherboard 12ab. The riser board 12cb is supported by an arm (not shown) of the tray 30b.

Expansion slot connectors are located on both sides of the riser board 12cb. As a result, the slots 42b are located on both sides of the riser board 12cb to accommodate expansion cards that extend from either side of the riser board 12cb. When inserted into the slots, the expansion cards are parallel to the motherboard 12cb. A fan 45b is mounted to the piece 33 of the tray 30b. The fan 45b blows air over the CPUs 200b of the motherboard 12ab.

Referring to FIG. 5, the tray 30c (for motherboard 12ac having the NLX form factor) has a riser board 12cc that is connected to an edge of the motherboard 12ac. The riser board 12cc extends orthogonally away from the motherboard 12ac and is supported by a plate (not shown) that extends orthogonally from the piece 33 of the tray 30c. The plate is located between the board 12cc and the power supply 50c. The riser board 12cc has expansion slot connectors on one side only, and expansion cards inserted into these slots extend over and are parallel with the motherboard 12ac. Slots 42c are formed in the rear piece 43c of the tray 30c and are aligned with communication ports of the expansion cards. The slots 42c are parallel to the motherboard 12ac. A fan 45c is built into the rear face 43c of the tray 30c.

Although each tray 30a, 30b and 30c has a different design, the outer physical dimensions of each tray 30a, 30b and 30c are the same, an arrangement that permits all three trays 30a, 30b and 30c to be used with the same chassis 401. To accomplish this uniformity in size, the overall width, depth and height of the tray 30 is constructed to accommodate the largest dimensions required by one of form factors, i.e., the dimensions required by a custom ATX form factor when the trays 30a, 30b and 30c are used.

Figure 6:
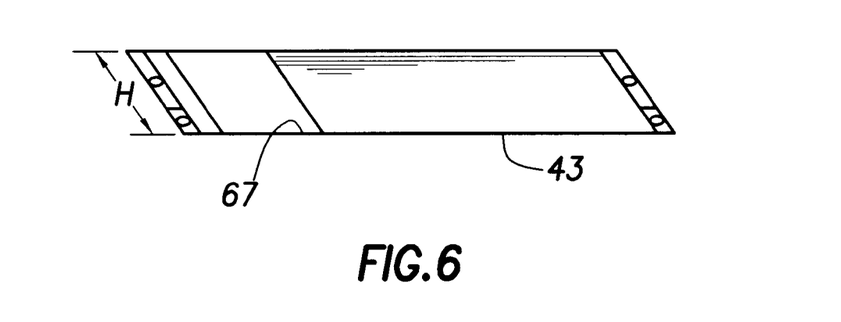
FIGS. 6, 7 and 8 are perspective views of faces of the rear trays.
Figure 7:
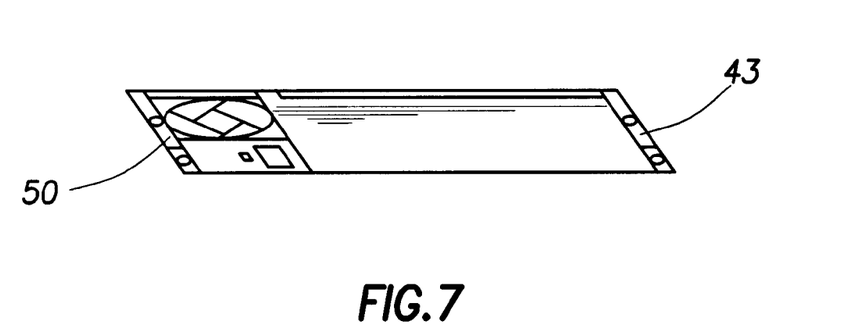
Figure 8:
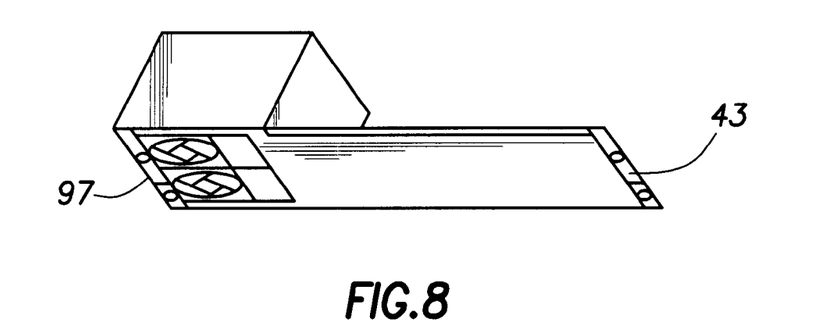

Referring to FIGS. 6–8, the non-hot plug power supply 50 may be replaced by a hot plug power supply 97. To accomplish this, the height H of the rear piece 43 is sufficient to accommodate both the non-hot plug power supply 50 and a hot plug power supply 97 which typically is the taller of the two. The rear piece 43 has an opening 67 that is closed by a face 50A of the non-hot plug power supply 50 (see FIG. 7) and allows access to the hot plug power supply modules of the hot plug power supply 97 (see FIG. 8).

The remaining system boards 12 of the computer system 400 that are not secured to the tray 30 are mounted to the chassis 401. These remaining system boards 12 include a peripheral backplane board 12b (see FIG. 18) and a power supply backplane board 12d (see FIG. 18). When the tray 30 is pushed all the way into the chassis 401, the motherboard 12a plugs into the peripheral backplane board 12b, and the riser board 12c and the power supply 50, 97 plugs into the power supply backplane board 12d.

In some arrangements, besides being mounted to the chassis 401, the peripheral backplane board 12b is mouunted to a front tray 60 (see FIG. 9), described below.

Figure 9:
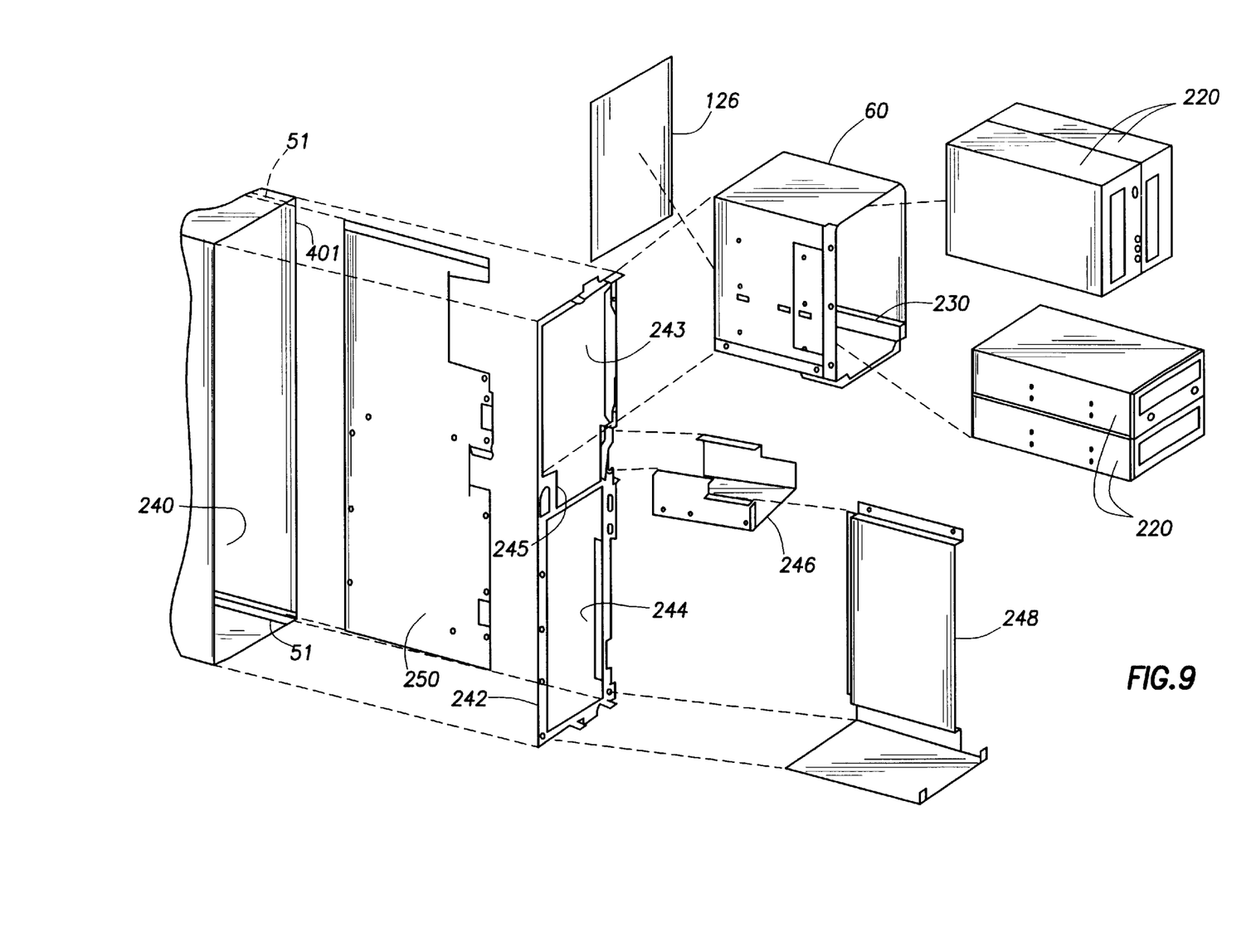
FIG. 9 is an exploded perspective view of the front portion of the computer system of FIG. 1.

Referring to FIG. 9, besides being specifically designed to accommodate different types of motherboards 12a and power supplies 50 and 97, the computer system 400 is also constructed to orient removable mass storage devices 220 (e.g., a CD-ROM drive or a tape storage drive) according to the orientation of chassis 401. Thus, regardless of whether the chassis 401 lays on its broad face (for a rack system) or stands vertically upright (for a tower system), the construction of the system 400 allows the media ports of the devices 220 to always be horizontal.

To secure the mass storage devices 220 to the chassis 401, the devices 220 are mounted to a tray 60 which is essentially a box-like shell that is constructed to cradle the devices 220 and is constructed to be inserted into a front opening 240 of the chassis 401. With respect to the chassis 401, the orientation of the tray 60 does not change for rack or tower configurations. Instead, the tray 60 is constructed to collectively hold the mass storage devices 220 in two different orthogonal positions (i.e., one position for a rack system and one position for a tower system) even through the collective width and height of the devices 220 are different.

To accomplish this, the tray 60 has a shoulder 230 formed in what would otherwise be an internal corner of the box-like tray 60. When the devices 220 are installed in either position, the shoulder 230 abuts one of the devices 220 to ensure the devices 220 fit snugly inside the tray 60. A plate (not shown) secures the two devices 220 together.

Figure 10:
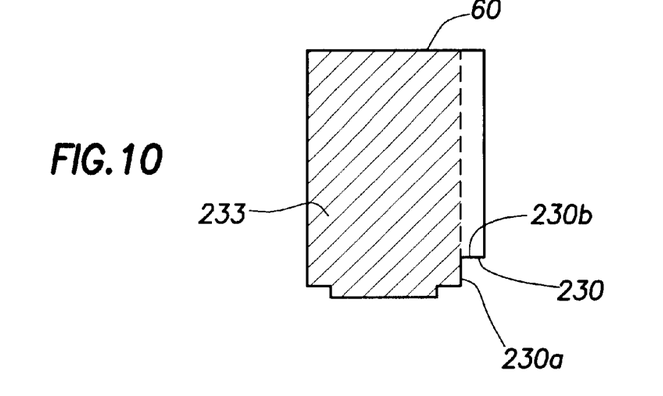
FIGS. 10 and 11 are front views of a media bay shell.
Figure 11:
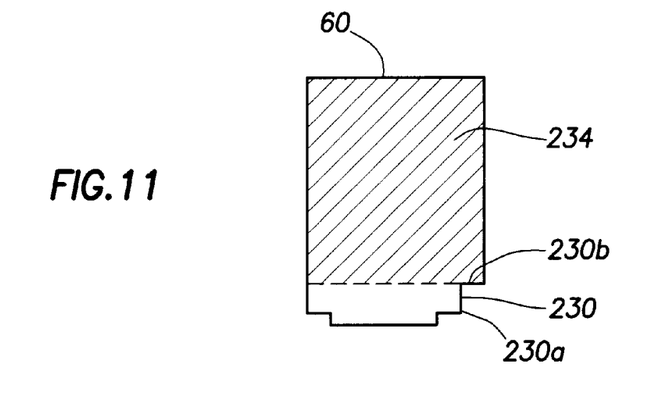

Referring to FIGS. 10 and 11, the shoulder 230 forms two regions 233 and 234 inside the tray 60. One edge 230a of the shoulder 230 forms a region 233 for mounting the mass storage devices 220 for a tower system. The other edge 230b of the shoulder 230 forms a region 234 for mounting the mass storage devices for a rack system.

As shown in FIG. 9, the tray 60 is constructed to fit inside an opening 243 of a frame 242 (mounted to the chassis 401) that extends around the periphery of the opening 243. To mount the tray 60, the tray 60 is inserted into the opening 243, and the front of the tray 60 is secured to the frame 242. The tray 60 is also secured to a metal sheet 250 that is slidably connected to the chassis 401 via the guide rails 51.

The peripheral backplane board 12b is mounted on a rear open face of the tray 60 and electrically connects the mass storage devices 220 to the motherboard 12a. In other arrangements, the peripheral backplane board 12b is mounted to the chassis 401. To connect the mass storage devices 220 to the peripheral backplane board 12b, storage device communication cables (e.g., IDE/SCSI cables) extend from the devices 220 and plug into the backplane board 12b.

The mass storage devices 220 may also include, but are not limited to, for example, two, 1.6 inch hot plug drives or three, 1.0 inch hot plug drives. The computer system 400 also includes a permanently mounted floppy disk drive 219 and hot plug drives 221 which plug into the peripheral backplane board.

To mount the floppy disk drive 219, the drive 219 is inserted into a cage 246 which is constructed to cradle the drive 219 and fit inside an opening 245 of the frame 242 to mount to the metal sheet 250. The hot plug drives 221 are mounted to an L-shaped tray 248 that is constructed to fit through an opening 244 of the frame 242 and mount to the sheet 250.

Among the other features of the computer system 400, the chassis 401 has an access door 108 that swings open to permit access to components (e.g., memory modules, processor modules or processors) of the motherboard 12a and to allow insertion/removal of expansion cards to/from the riser board 12c.

In other arrangements, more (e.g., four) or fewer (e.g., two) trays are used to accommodate the motherboard form factors. In some arrangements, the tray 60 may be designed to hold more (e.g., three) or fewer (e.g., one) mass storage devices. In other arrangement, the power supply is not mounted to the tray.

In other arrangements, the computer system 400 may have other trays that are designed to hold other boards 12 or peripheral devices of the system 10. For example, the computer system 400 might have a tray specifically designed for the power supply 50 so that the power supply 50 can be removed without removing other boards or peripheral devices of the system 10. Other trays may be used that accommodate other classes of form factors.

Figure 12:
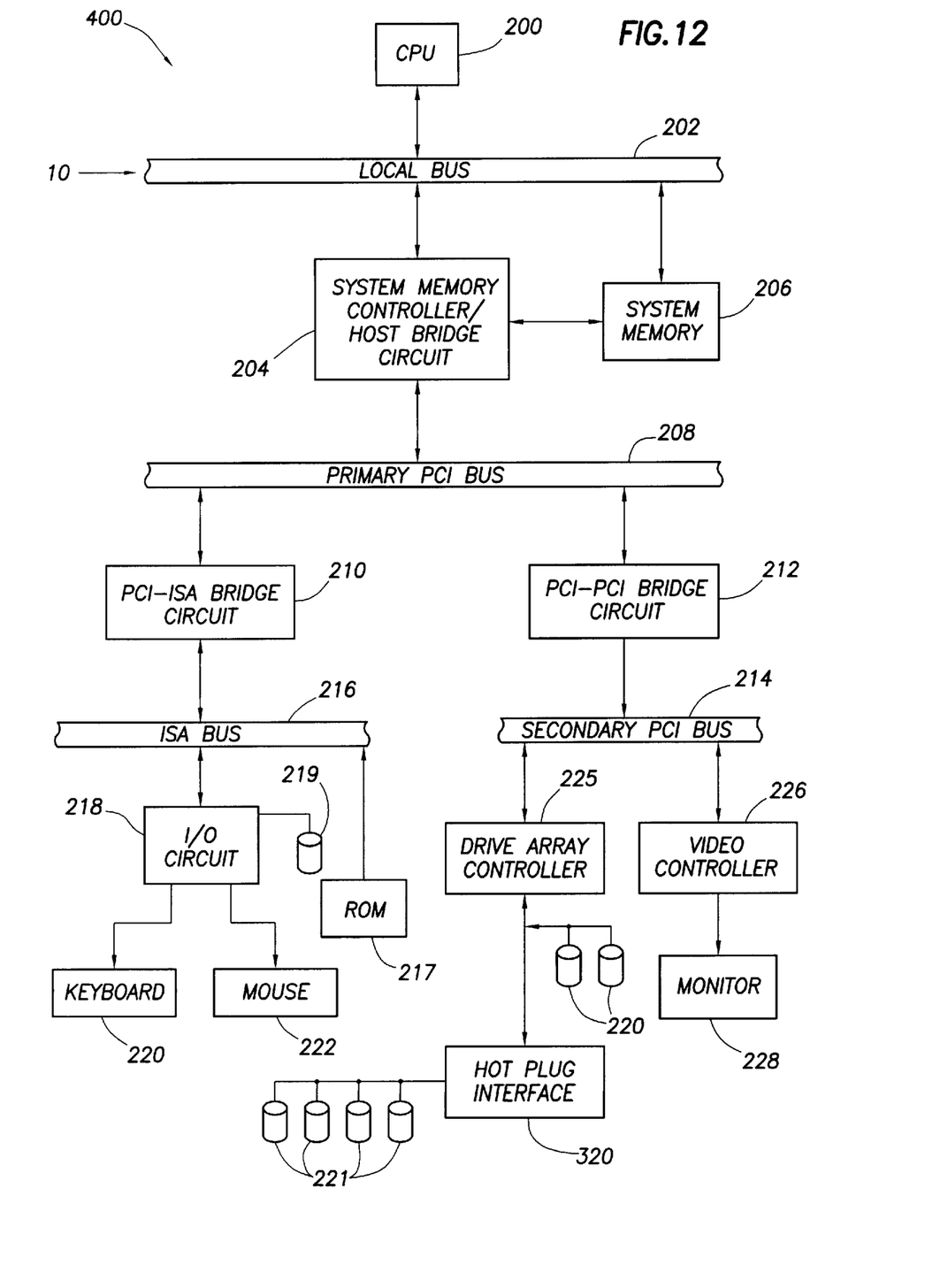
FIG. 12 is an electrical schematic diagram of the computer system of FIG. 1.
Figure 20:
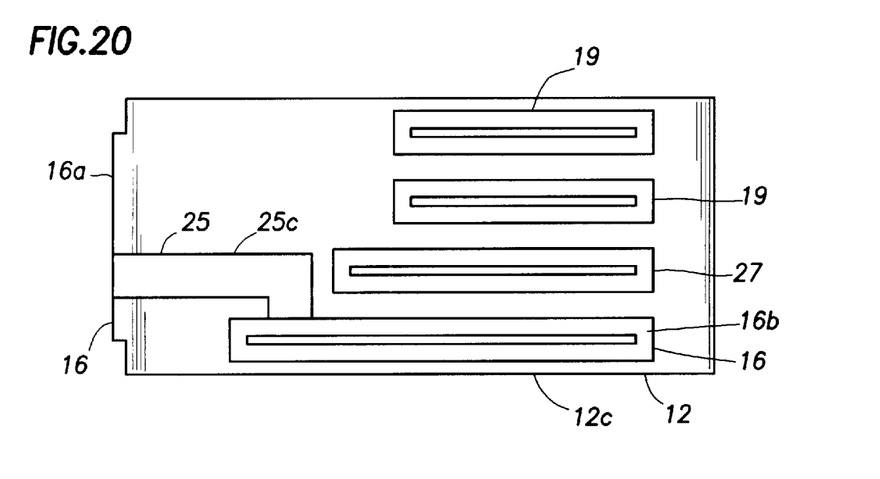

Referring to FIG. 12, electrically, the motherboard 12a has at least one central processing unit (CPU) 200, a system memory controller/host bridge circuit 204 and a system memory 206, all of which are connected to a local bus 202. The circuit 204 interfaces the local bus 202 to a primary Peripheral Component Interconnect (PCI) bus 208. Also on the motherboard 12a is a PCI-PCI bridge circuit 212 that interfaces the bus 208 to circuitry of one or more expansion cards through a secondary PCI bus 214. The bus 214 is located on the motherboard 12a and is extended to PCI expansion cards through one or more expansion slot connectors 19 (see FIG. 20) on the riser board 12c.

Also located on the motherboard 12a are drive array controller 225 and a video controller 226 which are coupled to the PCI bus 214. In some arrangements, the controller 225 is located on an expansion card, and in some arrangements, the video controller 226 is located on an expansion card. The controller 225 controls operation of non-hot plug hard disk drives 240 and is interfaced to hot plug disk drives 221 through a hot plug interface 320. The video controller 226 drives a monitor 228.

Also located on the motherboard 12a is a PCI-Industry Standard Architecture (ISA) bridge circuit 210. The circuit 210 interfaces the PCI bus 208 to an ISA bus 216 which is extended to ISA expansion cards through one or more ISA slot connectors 27 (see FIG. 20) on the riser board 12c. Connected to the ISA bus 216 are an input/output (I/O) circuit 218 and a read only memory (ROM) 217. The I/O circuit 218 receives input from input/output devices, such as a keyboard 220 and a mouse 222. The I/O circuit 218 also controls operations of the floppy disk drive 219. In some arrangements, all or part of the circuitry connected to the ISA bus 216 are located on expansion cards.

The system boards 12 of the computer system 400 are constructed and arranged in a manner to form a cableless network for carrying power and communication signals among the boards 12. The network is formed by arranging the boards 12 so that adjacent, orthogonal boards 12 plug into each other and are constructed so that traditional cabling between the boards 12 is replaced by circuitry of the boards 12. As a result, the boards 12 or peripheral devices mounted on the trays simply plug into the other boards 12 of the system 400.

Figure 15:
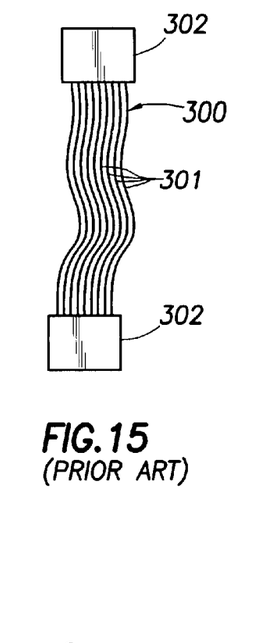
FIGS. 15 and 16 are views of flexible connectors.
Figure 16:
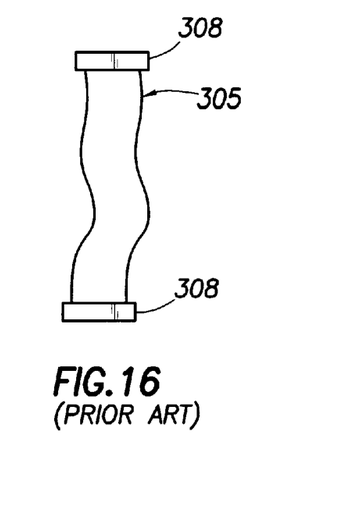

Referring to FIGS. 15 and 16 unlike the system 400, traditional computer systems have extensively used flexible connectors (e.g., cables) to electrically connect system boards together. For example, one type of cable, a power supply harness cable 300 (see FIG. 15), has traditionally been used to electrically connect system boards and peripheral devices (e.g., a floppy disk drive, a hard disk drive and a CD-ROM drive) to a power supply backplane board so that the boards 12 have power to operate. In this manner, one end plug 302 of the cable 300 is plugged into the power supply backplane board and the other end plug 302 of the cable 300 is plugged into the system board or peripheral device. Flexible wires 301 extend between the end plugs 302 and provide flexibility in running and connecting the cable 300. The wires 301 include, for example, DC voltage supply wires and ground wires.

Referring to FIG. 16, another type of cable, a ribbon cable 305, has typically been used to electrically bus communication signals (e.g., signals from a Small Communication Systems Interface (SCSI) bus or an Intelligent Electronics Device (IDE) bus) of a motherboard to a backplane board (e.g., a riser board or a peripheral device backplane board). In this manner, the ribbon cable 305 has one end plug 308 that connects to the motherboard, and another end plug 308 that connects to the backplane board. A plastic web of flexible wires 305 extends between the two end plugs 308. Like the harness cable 300, the ribbon cable 305 provides flexibility in running and connecting the cable 305.

Unlike traditional computer systems that use extensive cabling to electrically connect system boards together, the system boards 12 of the computer system 400 are constructed and arranged to form a cableless network for distributing power and communication signals throughout the system 400.

Figure 13:
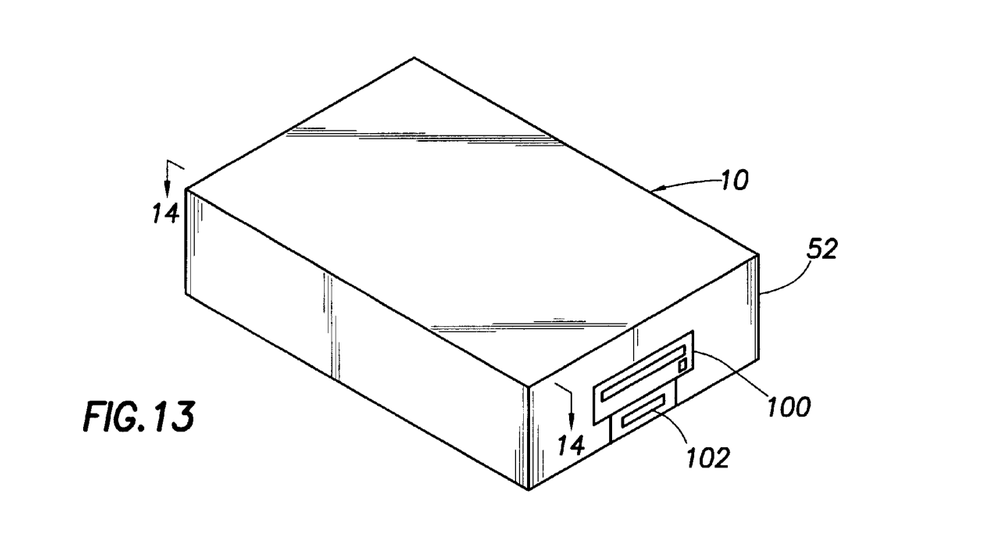
FIG. 13 is a perspective view of another computer system.
Figure 14:
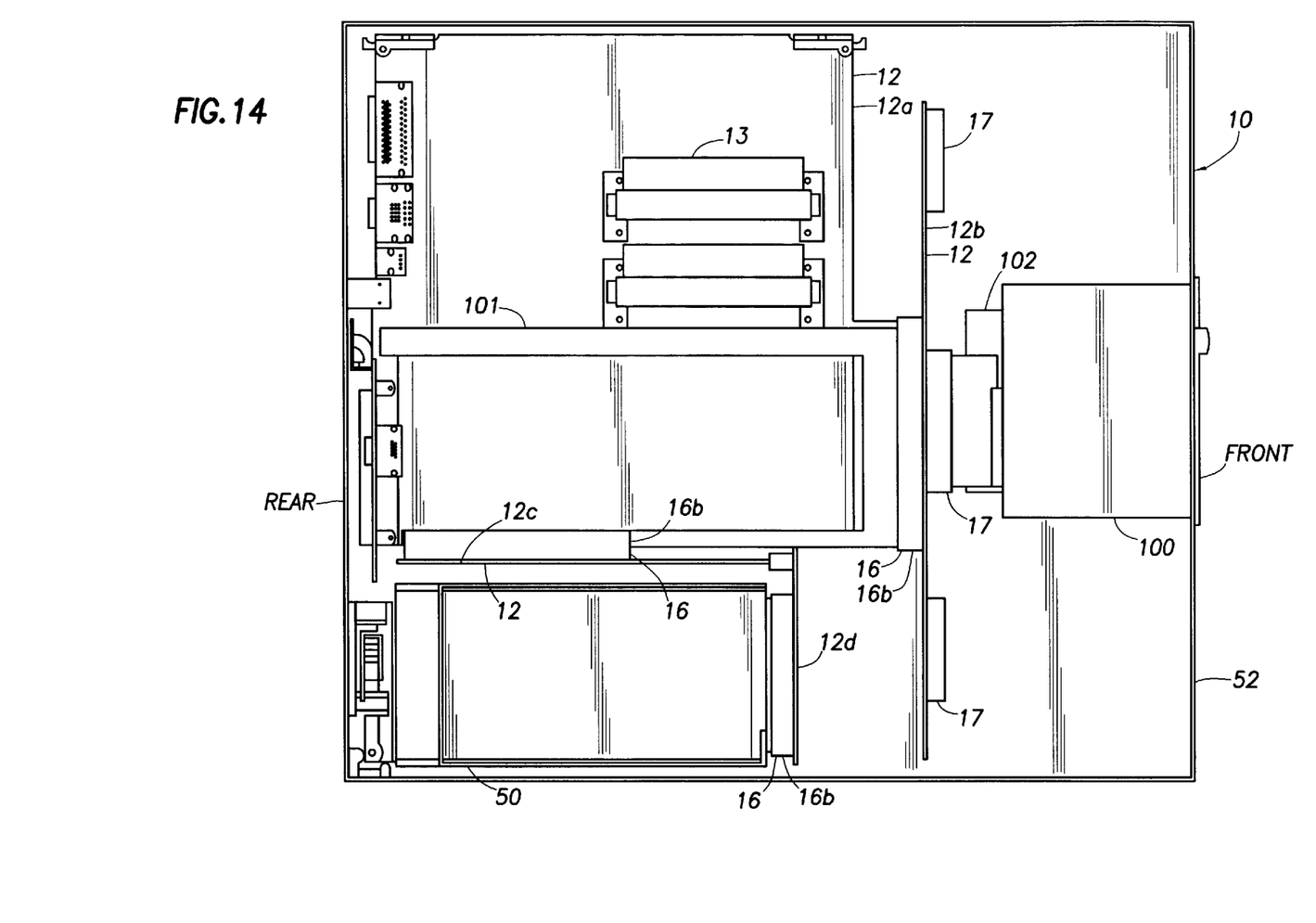
FIG. 14 is a cross-sectional view taken along line 14—14 of FIG. 13.
Figure 17:
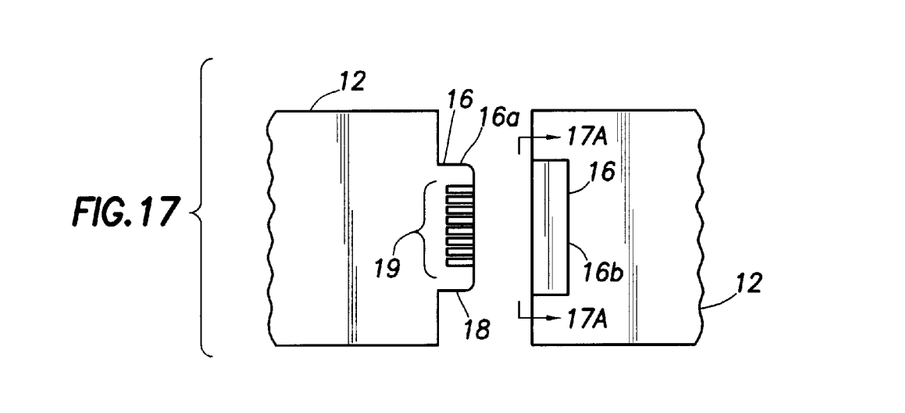
FIG. 17 is a top view of rigid connectors.
Figure 18:
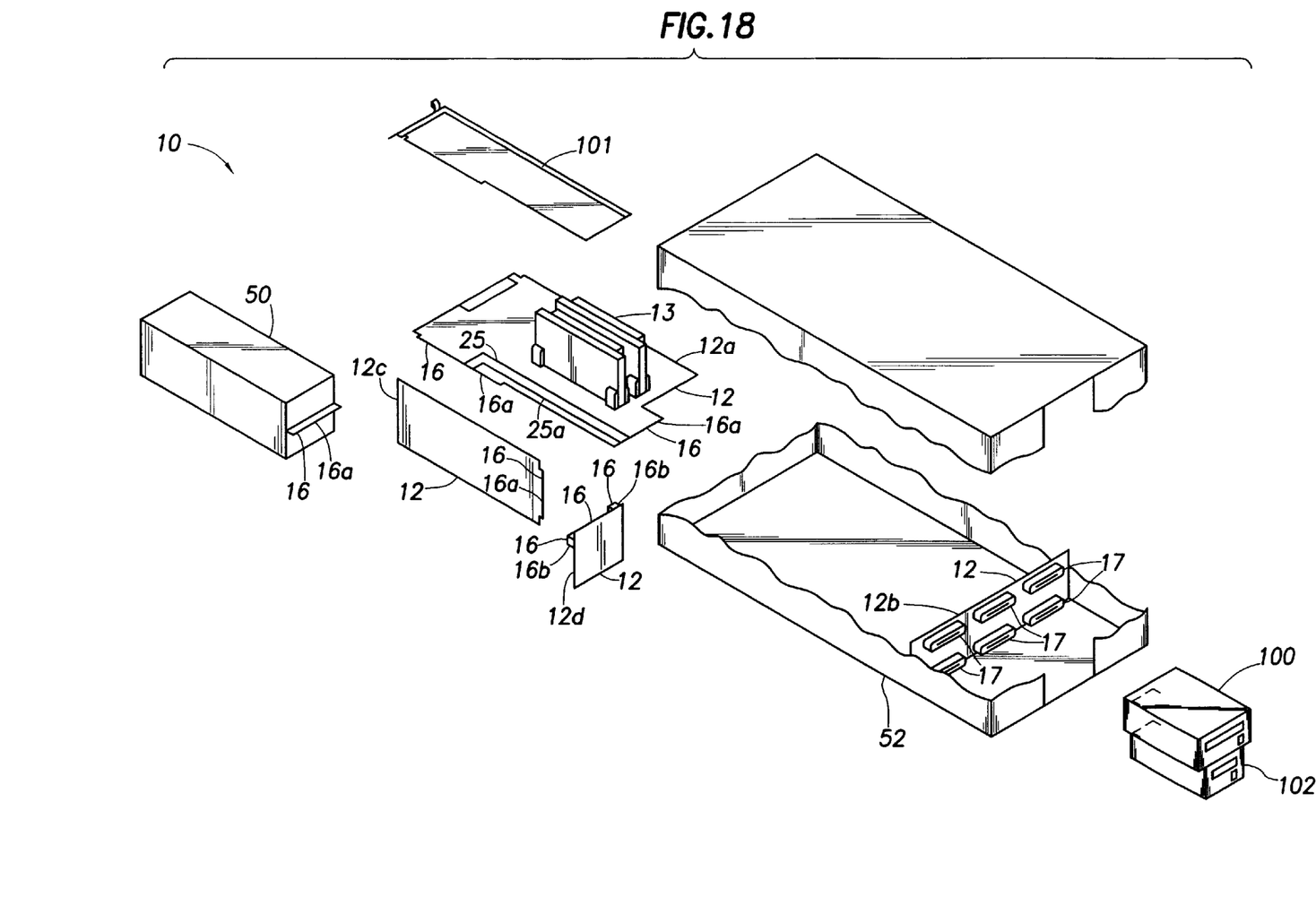
FIG. 18 is an exploded perspective view of the computer system of FIG. 13.

Referring to FIGS. 13, 14 and 18, this cableless network is shown in a computer system 10 that is similar in design to the computer system 400, with the differences pointed out below. The cableless network is formed from electrical traces on the system boards 12 and rigid, plug-type connectors 16 (see FIG. 17) of the boards 12 that mechanically and electrically connect the boards 12 together.

The motherboard 12a includes circuitry (e.g., memory modules 13 that extend upwardly from the motherboard 12a and a central processing unit 200 (see FIG. 22)) that needs to communicate with other system boards 12, such as a peripheral backplane board 12b and an expansion card riser board 12c. To accomplish this, the motherboard 12a is constructed to form a plug-type connection with the upwardly extending peripheral backplane board 12b and with the upwardly extending riser board 12c.

The peripheral backplane board 12b is orthogonal to the motherboard 12a, and the front face of the peripheral backplane board 12b faces mass storage devices (e.g., a floppy disk drive 100 and a CD-ROM drive 102). The rear face of the backplane board 12b faces the motherboard 12a. The mass storage devices plug into the front face of the peripheral backplane board 12b, and circuitry on the motherboard 12a communicates with these mass storage devices through the motherboard's plug-type connection with the peripheral backplane board 12b.

The riser board 12c extends from near the rear of the chassis 52 toward the front of the chassis 52, and the faces of the riser board 12c face opposite sides of the chassis 52. Through the riser board's plug-type connection with the motherboard 12a, expansion cards 101 plugged into expansion slots of the riser board 12c can communicate with circuitry of the motherboard 12a and the mass storage devices.

The system boards 12 are connected to each other not only for purposes of communication but also to form a power distribution network. In this manner, the boards 12 cooperate to distribute, or transfer, power from a power supply 50 throughout the system 10 without using cables. The power supply 50, located near the rear of the chassis 52, is constructed to form a plug-type connection with an upwardly extending power supply backplane board 12d that faces the front and rear of the chassis 52. Typically, cables extend from the power supply backplane board 12d to distribute power to the system boards 12. However, in the system 10, the riser board 12c is also constructed to form a rigid, plug-type connection with the power supply backplane board 12d, and all power leaving the power supply backplane board 12d goes through the rigid connection and onto the riser board 12c.

Figure 19:
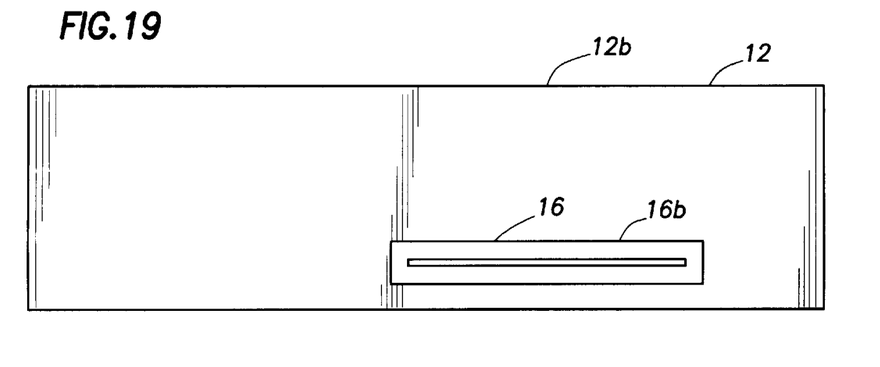
FIGS. 19, 20 and 21 are views of system boards of the computer system of FIG. 13.
Figure 21:
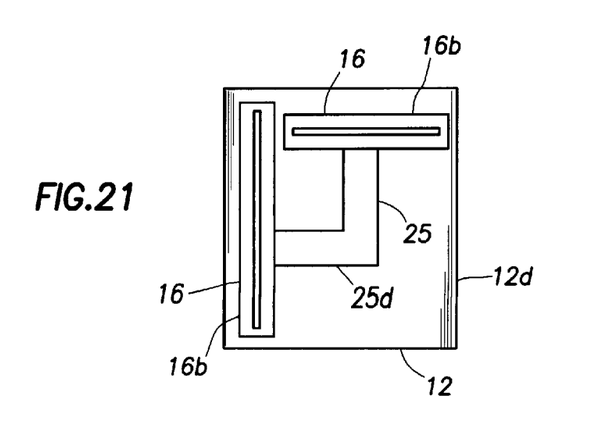

The power supply distribution network uses power buses 25 that are formed on the boards 12. Each power bus 25 includes conductive traces that carry different DC supply voltage levels (e.g., 3.3 V, 5 V, −5V and 12V levels). In this manner, the power supply backplane board 12d (see FIG. 21) has a bus 25d that is constructed to carry power from the power supply 50 to the riser board 12c. The riser board 12c (see FIG. 20) has a power bus 25c to transfer supply power to the motherboard 12a, and the motherboard 12a has a power bus 25a (see FIG. 18) to transfer power to the peripheral backplane board 12b (see FIG. 19). All of the power passes through the rigid connections formed between the boards 12.

Figure 17A:
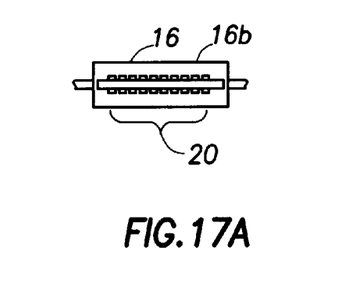
FIG. 17A is a cross-sectional view taken along line 17A—17A of FIG. 17.

Referring to FIG. 17, the plug-type connections between the system boards 12 are formed by a set of two, rigid connectors 16 (e.g., a card edge connector and a card edge). Because the rigid connectors 16 are part of the system boards 12, the rigid connectors 16 consume a minimal amount of space. Each set of connectors 16 includes a male connector 16a (part of one system board) that is configured to mate with a female connector 16b (part of the other, mating system board). Often called a gold finger connector, the male connector 16a is formed from a plug extension 18 of the board 12 and conductive traces, or fingers 21, that are located on the top and bottom faces of the plug extension 18. The female connector 16b has internal spring contacts 20 (see FIG. 17A) that are configured to contact the fingers 19 when the connectors 16a and 16b are plugged together. Other rigid connectors 16 may be used.

Thus, the construction and arrangement of the system boards 12 establish a power supply network and a communication network for the computer system 10. All of the signals in these networks pass through the connectors 16.

The plug-type connections between the boards 12 also allows quick assembly and disassembly of the system 10. For example, the motherboard 12a and riser board 12c may be easily removed from the chassis 52 by pulling on the motherboard 12a to dislodge the motherboard 12a from the peripheral backplane board 12b and disconnect the riser board 12c from the power supply backplane board 12d.

As discussed above, in some arrangements, the motherboard 12a and the power supply 50 are mounted on a tray that slides into the rear of the chassis, and the peripheral backplane board 12b is permanently mounted to the chassis. For these arrangements, the motherboard 12a and power supply 50 are removed from the chassis by simply pulling the tray from the chassis, and the motherboard 12a and power supply 50 are installed by pushing the tray into the chassis.

One difference between the computer system 10 and the computer system 400 is that the chassis 401 is replaced by a chassis 52 which rests on its broad face and does not have rails. A rear face of the chassis 401 is open which allows the power supply 50, the motherboard 12a, and riser card 12c to be inserted and removed via the tray 30. The rear face of the chassis 52 is open and closed by a rear, removable tray (not shown). The motherboard 12a and riser board 12c are mounted to the tray, and the power supply 50 is mounted to the chassis 52. Unlike the chassis 401, the chassis 52 does not have the guide rails 51 to permit the chassis 401 to be used in either a rack or a tower system. A floppy drive 100 and a CD-ROM drive 102 of the system 10 replace the mass storage devices of the system 400.

Figure 22:
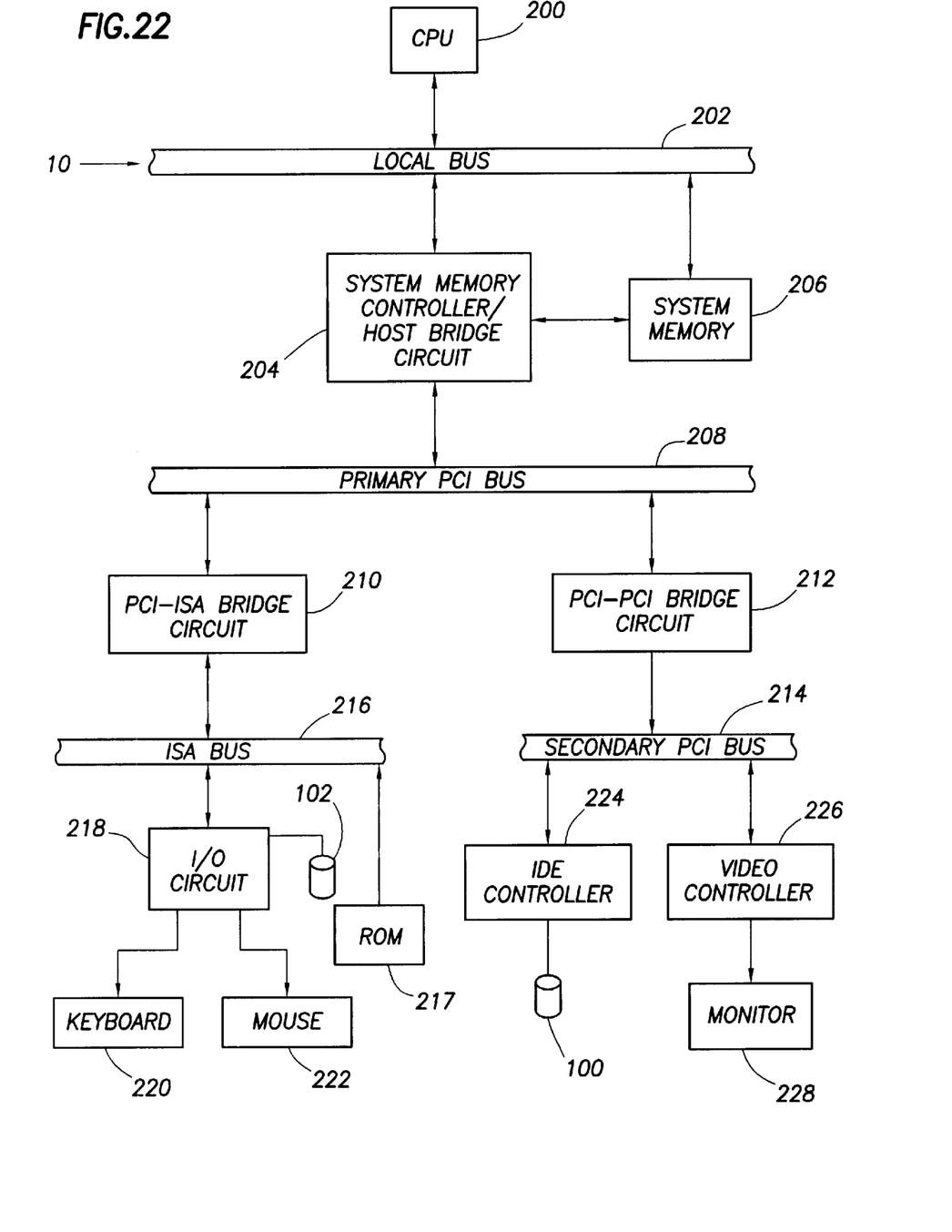
FIG. 22 is an electrical schematic diagram of the computer system of FIG. 13.

Referring to FIG. 22, electrically, the computer system 10 has a similar design to the computer system 400, with some of the differences pointed out below. The IDE controller 224 replaces the drive controller 225. The mass CD-ROM drive 102 replaces the mass storage devices 220. Unlike the computer system 10, the computer system 400 has the hot plug interface 320 that interfaces the hot plug drives 221 to the drive controller 225.

Other embodiments are within the scope of the following claims.

What is claimed is:

1. A computer system comprising:
   a chassis defining a top region, a bottom region, and two side regions;
   a first mass storage device; and
   a tray defining a top region, a bottom region and two side regions, said tray forming a detachable connection with the chassis only in orientations where the top region of the tray and the top region of the chassis are substantially parallel, said tray further adapted to hold the first mass storage device in at least two different orientations with respect to the tray.

2. The computer system of claim 1, wherein the at least two different orientations are substantially orthogonal to each other.

3. The computer system of claim 1, wherein the tray includes a shoulder defining a first region for receiving the first mass storage device in one of the orientations and a second region for receiving the first mass storage device in another one of the orientations.

4. The computer system of claim 1, further comprising:
   a second mass storage device; and
   said tray is capable of holding the first mass storage device and the second mass storage device in at least two different orientations.

5. A method of configuring a computer system comprising:
   configuring different trays to mount different motherboards;
   configuring each of the trays to detachably mount to a chassis;
   mounting a motherboard to a selected tray; and
   attaching the selected tray to the chassis by slidably inserting said selected tray within the chassis.

6. The method of claim 5, wherein the different motherboards have different form factor standards.

7. The method of claim 6, wherein the form factor standards include an NLX form factor standard.

8. The method of claim 6, wherein the form factor standards include an LPX form factor standard.

9. The method of claim 6, wherein the form factor standards include an ATX form factor standard.

10. The method of claim 6, wherein the form factor standards include a custom ATX form factor standard.

11. The method of claim 6, wherein the form factor standards include a baby AT form factor standard.

12. The method of claim 6, wherein the form factor standards include:
    a NLX form factor standard;
    an LPX form factor standard; and
    a form factor standard selected from one of the following:
        an ATX form factor standard,
        a custom ATX form factor standard, and
        a baby AT form factor standard.

13. The method of claim 5, further comprising:
    mounting a power supply to each of the trays.

14. The method of claim 5, further comprising:
    configuring the tray to mount at least two different types of power supplies.

15. The method of claim 5, further comprising:
    mounting a system board to the chassis; and
    configuring the system board to form a pluggable connection with the power supply.

16. The method of claim 15, wherein the system board comprises a power supply backplane board.

17. The method of claim 5, further comprising:
    mounting a fan to the tray.

18. The method of claim 5, further comprising:
    connecting a riser board to the motherboard.

19. The method of claim 18, further comprising:
    mounting a system board to the chassis; and
    configuring the system board to form a pluggable connection with the riser board.

20. The method of claim 5, further comprising:
    mounting a system board to the chassis; and
    configuring the system board to form a pluggable connection with the motherboard.

21. The method of claim 20, wherein the system board comprises a peripheral backplane board.

22. The method of claim 5, wherein the chassis comprises a shell.

23. The method of claim 5, further comprising:
    configuring another tray configured to form a slidable connection with the chassis; and
    mounting a mass storage device to said another tray.

24. A method of configuring a computer system comprising:
    configuring a tray to form a slidable and detachable connection with a chassis in only one orientation;
    mounting a mass storage device to the tray; and
    configuring the tray to hold the mass storage device in at least two orientations.

25. The method of claim 24, wherein the two positions are substantially orthogonal to each other.

* * * * *